United States Patent
Lin et al.

(10) Patent No.: US 10,580,700 B1
(45) Date of Patent: Mar. 3, 2020

(54) METHOD FOR AVOIDING CRACK FORMATION DURING LASER LIFT-OFF PROCESS

(71) Applicant: MIKRO MESA TECHNOLOGY CO., LTD., Apia (WS)

(72) Inventors: Yi-Ching Lin, Tainan (TW); Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/276,638

(22) Filed: Feb. 15, 2019

(51) Int. Cl.
*H01L 21/78* (2006.01)
*H01L 21/268* (2006.01)

(52) U.S. Cl.
CPC ........ *H01L 21/7813* (2013.01); *H01L 21/268* (2013.01)

(58) Field of Classification Search
CPC ............... H01L 21/268; H01L 21/7806; H01L 21/7813
See application file for complete search history.

(56) References Cited

U.S. PATENT DOCUMENTS

2013/0143389 A1* 6/2013 Henley ................ H01L 21/268
438/463

* cited by examiner

*Primary Examiner* — Daniel P Shook
(74) *Attorney, Agent, or Firm* — CKC & Partners Co., LLC

(57) ABSTRACT

A method for avoiding crack formation during a laser lift-off process is provided. The method includes: forming a composite glue layer on a carrier substrate in which the composite glue layer includes an ultraviolet glue and fillers therein and a Young's modulus of the fillers is greater than a Young's modulus of the ultraviolet glue; placing a semiconductor structure onto the composite glue layer in which the semiconductor structure includes a growth substrate, an epitaxial layer present on the growth substrate, and a metal layer present on the epitaxial layer, wherein placing the semiconductor structure makes the metal layer be in contact with and attached to the composite glue layer; and performing the laser lift-off process to separate the growth substrate from the epitaxial layer.

7 Claims, 8 Drawing Sheets

METHOD FOR AVOIDING CRACK FORMATION DURING LASER LIFT-OFF PROCESS

BACKGROUND

Field of Invention

The present disclosure relates to a method of preventing crack formation during fabrication process of semiconductor devices.

Description of Related Art

The statements in this section merely provide background information related to the present disclosure and do not necessarily constitute prior art.

In recent years, micro devices have become popular in various applications. Among all technical aspects of micro devices, one of the important issues is a yield during fabrication processes.

SUMMARY

According to some embodiments of the present disclosure, a method for avoiding crack formation during a laser lift-off process is provided. The method includes: forming a composite glue layer on a carrier substrate, in which the composite glue layer includes an ultraviolet glue and fillers therein and a Young's modulus of the fillers is greater than a Young's modulus of the ultraviolet glue; placing a semiconductor structure onto the composite glue layer, in which the semiconductor structure includes a growth substrate, an epitaxial layer present on the growth substrate, and a metal layer present on the epitaxial layer, and placing the semiconductor structure makes the metal layer be in contact with and attached to the composite glue layer; and performing the laser lift-off process to separate the growth substrate from the epitaxial layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
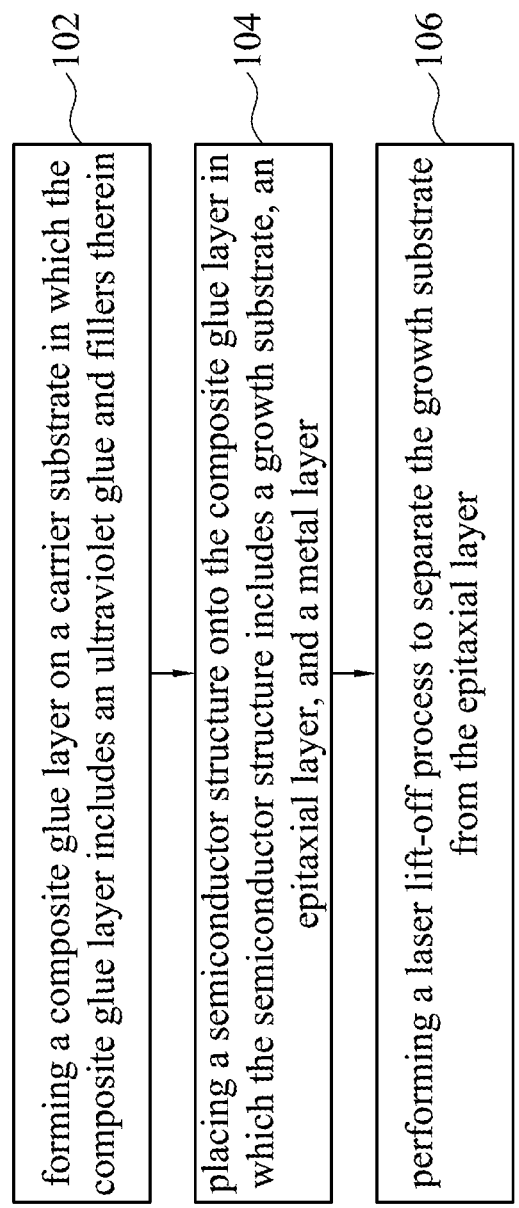
FIG. 1 is a schematic flow chart of a method for avoiding crack formation during a laser lift-off process according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIG. 1 and FIGS. 2A to 2D. FIG. 1 is a schematic flow chart of a method 100 for avoiding crack formation during a laser lift-off process according to some embodiments of the present disclosure. FIGS. 2A to 2D are schematic views of intermediate stages of the method 100 according to some embodiments of the present disclosure. In some embodiments, the method 100 for avoiding crack formation during a laser lift-off process is provided. The method 100 begins with an operation 102 in which a composite glue layer 220 is formed on a carrier substrate 210 (also referred to FIG. 2A). The method 100 continues with an operation 104 in which a semiconductor structure S is placed onto the composite glue layer 220 (also referred to FIG. 2B). The semiconductor structure S includes a growth substrate 250, an epitaxial layer 240', and a metal layer 230. The method 100 continues with an operation 106 in which a laser lift-off process LLO is performed to separate the growth substrate 250 from the epitaxial layer 240' (also referred to FIG. 2C).

Figure 2A:
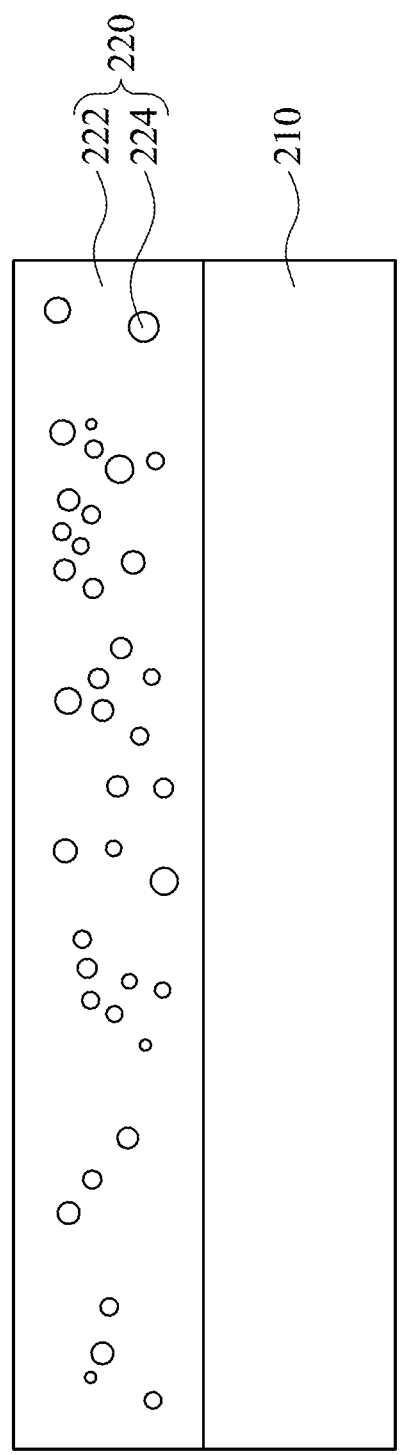
FIG. 2A is a schematic view of an intermediate stage of the method according to some embodiments of the present disclosure.
Figure 3:
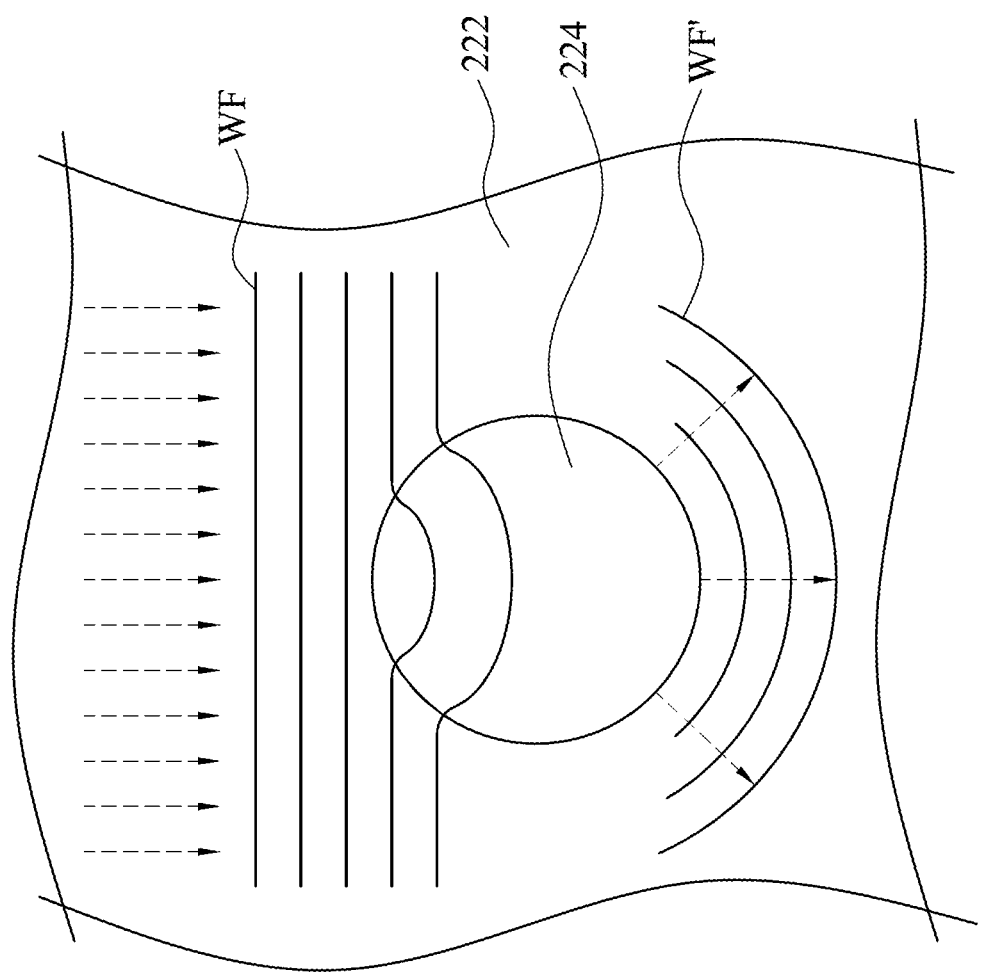
FIG. 3 is an enlarged schematic cross-sectional diagram illustrating propagations of wave fronts with a presence of one filler according to some embodiments of the present disclosure.

Reference is made to FIG. 2A in which the composite glue layer 220 is formed on a carrier substrate 210, and also made to FIG. 3. FIG. 3 is an enlarged schematic cross-sectional diagram illustrating propagations of wave fronts with a presence of one filler 224 according to some embodiments of the present disclosure. In some embodiments, the composite glue layer 220 includes an ultraviolet glue 222 and fillers 224 therein. A Young's modulus of the fillers 224 is greater than a Young's modulus of the ultraviolet glue 222, such that shock waves generated by the laser lift-off process LLO can be more uniformly spread over the whole composite glue layer 220 with the help of the fillers 224 instead of tending to be localized within a small region and forming cracks. FIG. 3 demonstrates shock waves having ideal plane wave fronts WF which originally propagate unidirectional (as indicated by dotted arrows above the wave fronts WF) becomes divergent (as indicated by dotted arrows within the wave fronts WF') after scattered by the filler 224. In some embodiments, a coefficient of thermal conductivity of the fillers 224 is greater than a coefficient of thermal conductivity of the ultraviolet glue 222 such that the fillers 224 can help to have heat more uniformly distributed in the composite glue layer 220, which can prevent the formation of cracks compared to the composite glue layer 220 without the existence of the fillers 224. The fillers 224 include organosilicon compounds. In some embodiments, the fillers 224 are spherical, such as polydimethylsiloxane (PDMS) balls. In some embodiments, a density of the PDMS balls is about 1.32 g/cm$^3$, diameters of the PDMS balls ranges from about 1 µm to about 20 µm, an average diameter of the PDMS balls is about 5 µm, and a temperature of thermal decomposition is greater than or equal to 400 degrees Celsius. In some embodiments, Dimthyl group of the PDMS balls can be replaced by other alkyl groups. In some embodiments, a proportion of the fillers 224 in the composite glue layer 220 is from about 5% to about 20% weight percentage. In some embodiments, a preferred proportion of the fillers 224 in the composite glue layer 220 is about 7.8%.

Figure 2B:
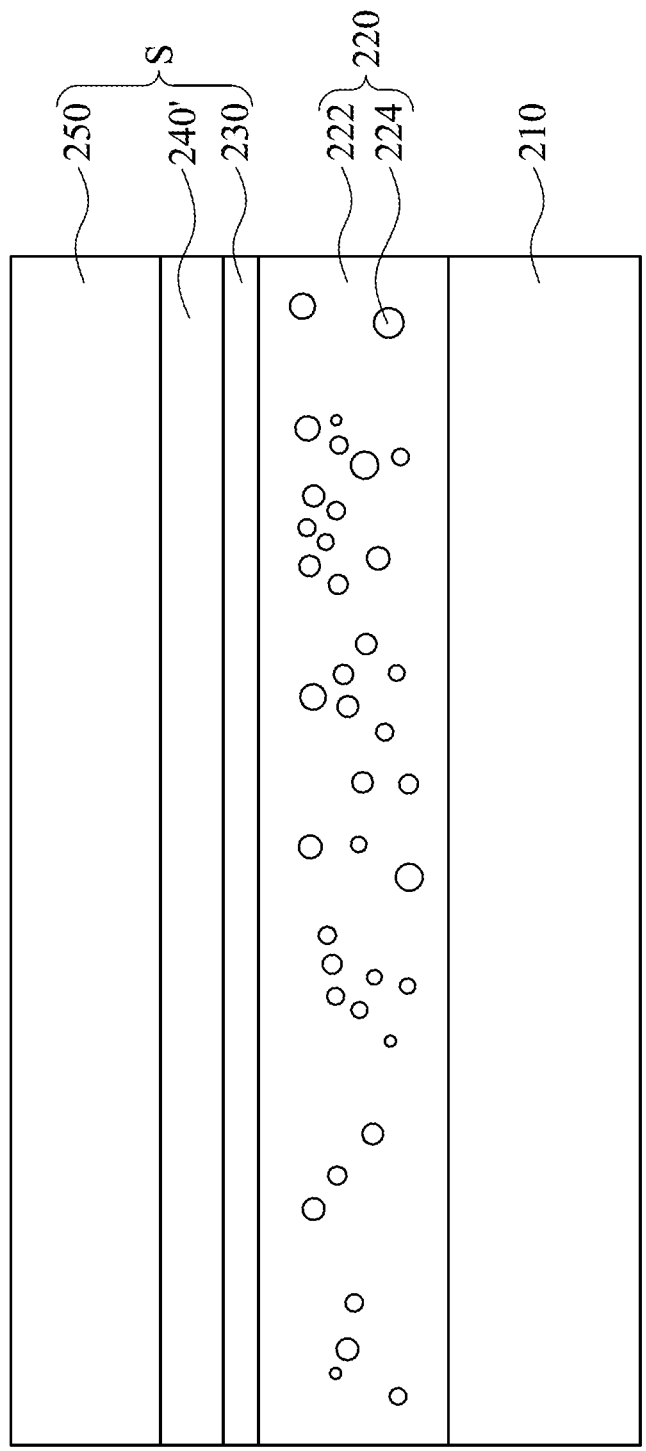
FIG. 2B is a schematic view of an intermediate stage of the method according to some embodiments of the present disclosure.
Figure 4:
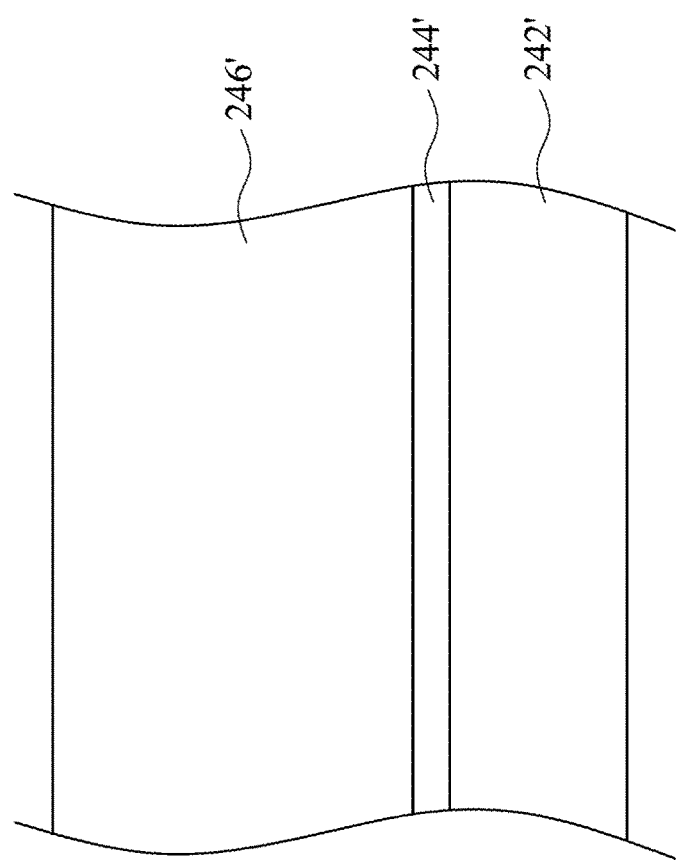
FIG. 4 is a schematic cross-sectional view of an epitaxial layer according to some embodiments of the present disclosure.

Reference is made to FIG. 2B in which the semiconductor structure S is placed onto the composite glue layer 220 and is also made to FIG. 4. FIG. 4 is a schematic cross-sectional view of the epitaxial layer 240' according to some embodiments of the present disclosure. In some embodiments, the epitaxial layer 240' is present on the growth substrate 250, and the metal layer 230 is present on the epitaxial layer 240'. When the semiconductor structure S is placed onto the composite glue layer 220, the metal layer 230 is in contact with and attached to the composite glue layer 220. In some embodiments, the metal layer 230 may include a noble metal, such as copper (Cu), ruthenium (Ru), rhodium (Rh), palladium (Pd), silver (Ag), platinum (Pt), gold (Au), or combinations thereof. In some embodiments, the metal layer 230 may include nickel (Ni), NiCu compound in which a weight percentage of Cu exceeds 50%, or a combination thereof. In some embodiments, a bonding layer may be included in the metal layer 230. The bonding layer may include tin (Sn), lead (Pb), bismuth (Bi), or combinations thereof. In some embodiments, an electrode may be included in the metal layer 230. The electrode may include gold (Au), Ag, Pt, chromium (Cr)/Au, Pt/Au, titanium (Ti)/Pt/Au, Ti/Au, Ni/Au-zinc (Zn), Ni/Au, Ni/Si, Ni/Cr/Au, or combinations thereof. In some embodiments, the epitaxial layer 240' includes a first type semiconductor layer 242', an active layer 244', and a second type semiconductor layer 246'. The active layer 244' is present on the first type semiconductor layer 242'. The second type semiconductor layer 246' is joined with the first type semiconductor layer 242' through the active layer 244'. The first type semiconductor layer 242' can be a p-type semiconductor layer, but should not be limited thereto. The second type semiconductor layer 246' can be an n-type semiconductor layer, but should not be limited thereto. In some embodiments, the first type semiconductor layer 242' is in contact with the metal layer 230, and the second type semiconductor layer 246' is in contact with the growth substrate 250, but should not be limited thereto.

Figure 2C:
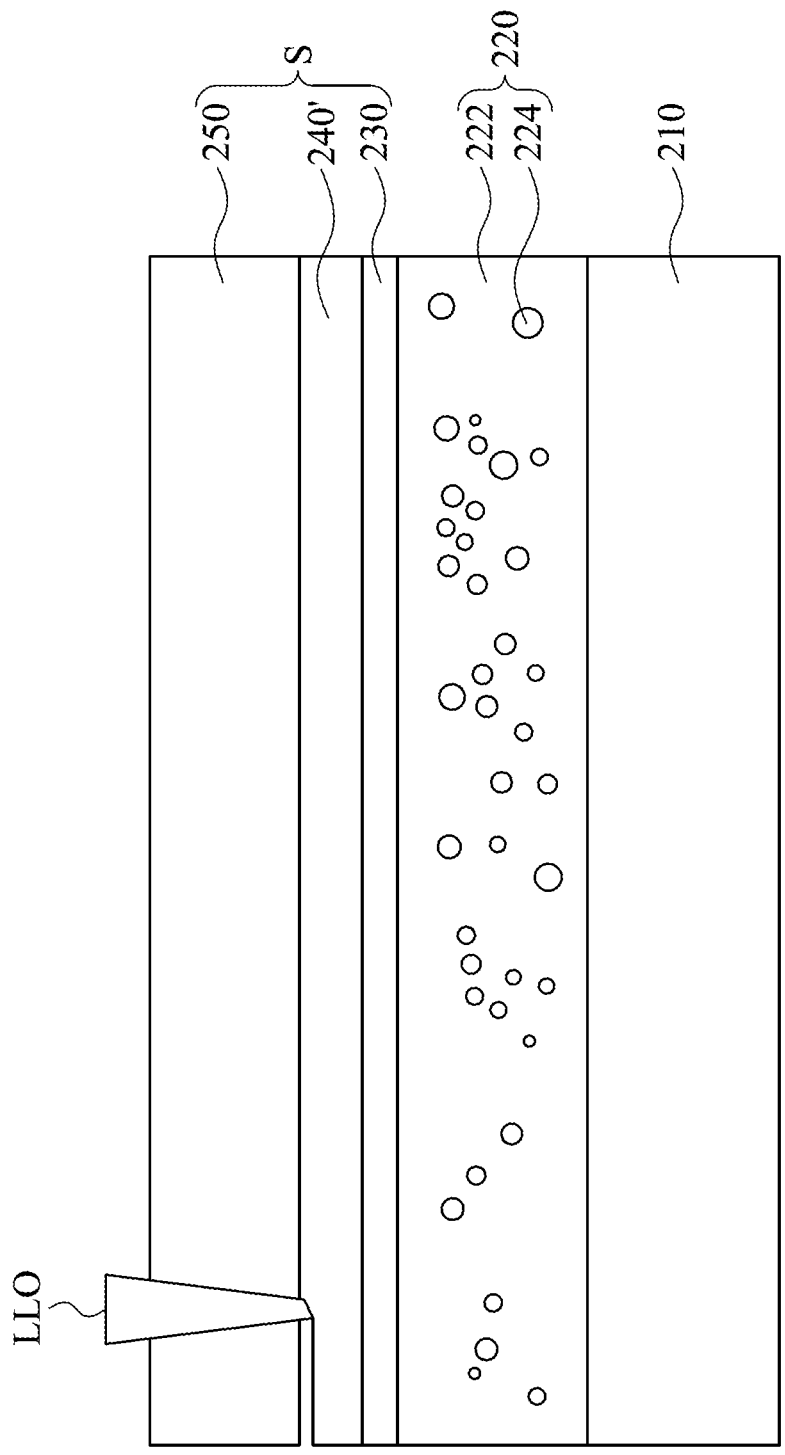
FIG. 2C is a schematic view of an intermediate stage of the method according to some embodiments of the present disclosure.
Figure 2D:
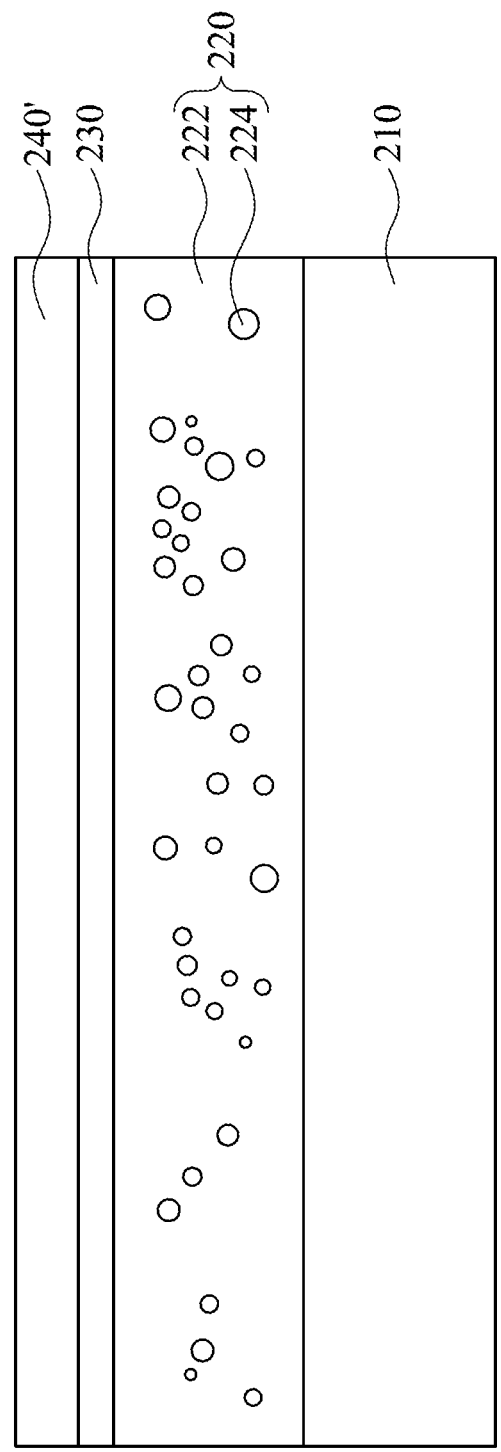
FIG. 2D is a schematic view of an intermediate stage of the method according to some embodiments of the present disclosure.
Figure 2E:
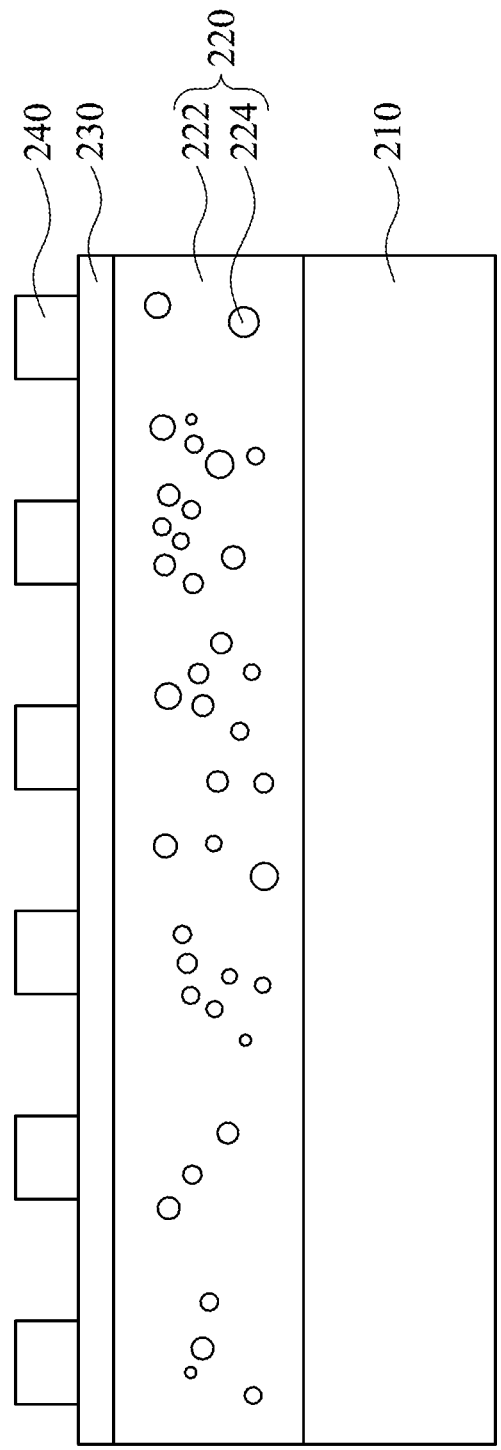
FIG. 2E is a schematic view of chipping an epitaxial layer to form a plurality of devices according to some embodiments of the present disclosure.

FIGS. 2C and 2D respectively show the operation 106 in which the laser lift-off process LLO is performed to separate the growth substrate 250 from the epitaxial layer 240' and a stage in which the growth substrate 250 is already separated from the epitaxial layer 240'. Reference is made to 2E. FIG. 2E is a schematic view of chipping the epitaxial layer 240' to form a plurality of devices 240 according to some embodiments of the present disclosure. In some embodiments, after the laser lift-off process LLO is performed to separate the growth substrate 250 from the epitaxial layer 240', the epitaxial layer 240' is chipped into a plurality of devices 240. In some embodiments, each of the devices 240 can be used as a light-emitting diode after being transferred to another substrate having electronic circuits present thereon.

In summary, the embodiments of the present disclosure provide a method for avoiding crack formation during a laser lift-off process. Fillers are mixed with a ultraviolet glue to form a composite glue layer in which a Young's modulus and a coefficient of thermal conductivity of the fillers are respectively greater than a Young's modulus and a coefficient of thermal conductivity of the ultraviolet glue, such that shock waves and heat are propagated and distributed more uniformly in the composite glue layer so as to prevent the formation of cracks.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for avoiding crack formation during a laser lift-off process, comprising:
    forming a composite glue layer on a carrier substrate, wherein the composite glue layer comprises an ultraviolet glue and fillers therein, and a Young's modulus of the fillers is greater than a Young's modulus of the ultraviolet glue;
    placing a semiconductor structure onto the composite glue layer, wherein the semiconductor structure comprises:
        a growth substrate;
        an epitaxial layer present on the growth substrate; and
        a metal layer present on the epitaxial layer, wherein placing the semiconductor structure makes the metal layer be in contact with and attached to the composite glue layer; and
    performing the laser lift-off process to separate the growth substrate from the epitaxial layer.

2. The method of claim 1, wherein the epitaxial layer comprises:
    a first type semiconductor layer;
    an active layer present on the first type semiconductor layer; and
    a second type semiconductor layer joined with the first type semiconductor layer through the active layer.

3. The method of claim 1, wherein the fillers comprise organosilicon compounds.

4. The method of claim 1, wherein the fillers are spherical.

5. The method of claim 1, wherein the metal layer comprises a noble metal.

6. The method of claim 1, further comprising chipping the epitaxial layer to form a plurality of devices.

7. The method of claim 1, wherein a coefficient of thermal conductivity of the fillers is greater than a coefficient of thermal conductivity of the ultraviolet glue.

\* \* \* \* \*